(12) United States Patent  
Prajuckamol et al.

(10) Patent No.: US 11,217,506 B2
(45) Date of Patent: Jan. 4, 2022

(54) SEMICONDUCTOR DEVICE ASSEMBLIES INCLUDING LOW-STRESS SPACER

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/721,375

(22) Filed: Dec. 19, 2019

(65) Prior Publication Data

US 2021/0193551 A1 Jun. 24, 2021

(51) Int. Cl.
| | | |
|---|---|---|
| *H01L 23/12* | (2006.01) |
| *H01L 23/34* | (2006.01) |
| *H01L 23/06* | (2006.01) |
| *H01L 23/48* | (2006.01) |
| *H01L 21/00* | (2006.01) |
| *H01L 23/367* | (2006.01) |
| *H01L 23/31* | (2006.01) |
| *H01L 25/07* | (2006.01) |
| *H01L 23/373* | (2006.01) |

(52) U.S. Cl.
CPC ...... *H01L 23/3675* (2013.01); *H01L 23/3107* (2013.01); *H01L 23/3121* (2013.01); *H01L 23/3735* (2013.01); *H01L 25/072* (2013.01)

(58) Field of Classification Search
CPC ............. H01L 23/3675; H01L 23/3121; H01L 25/072; H01L 25/0657; H01L 23/3735; H01L 25/0753; H01L 23/3107; H01L 23/367

See application file for complete search history.

(56) References Cited

U.S. PATENT DOCUMENTS

| 4,744,007 | A | * | 5/1988 | Watari | H01L 23/055 257/713 |
| 7,177,155 | B2 | * | 2/2007 | Lin | H01L 23/3675 361/704 |
| 2004/0174682 | A1 | * | 9/2004 | Lin | H01L 23/36 361/705 |
| 2004/0222515 | A1 | | 11/2004 | Choi et al. | |
| 2008/0001277 | A1 | * | 1/2008 | Wen | H01L 23/10 257/687 |
| 2013/0270687 | A1 | | 10/2013 | Kim et al. | |
| 2015/0319886 | A1 | * | 11/2015 | Albrecht, III | H05K 1/144 361/709 |
| 2016/0197063 | A1 | * | 7/2016 | Lin | H01L 23/5389 257/686 |
| 2020/0312736 | A1 | * | 10/2020 | Singh | H01L 23/5385 |

* cited by examiner

*Primary Examiner* — Alonzo Chambliss
(74) *Attorney, Agent, or Firm* — Brake Hughes Bellermann LLP

(57) ABSTRACT

In a general aspect, a semiconductor device assembly can include a substrate, a semiconductor die disposed on the substrate, a thermally conductive spacer having a first side and a second side, the second side being opposite the first side. The first side of the thermally conductive spacer can include a plurality of steps that are coupled with the substrate. The first side of the thermally conductive spacer can also include a surface that is disposed between the plurality of steps, where the surface can be coupled with the semiconductor die.

16 Claims, 7 Drawing Sheets

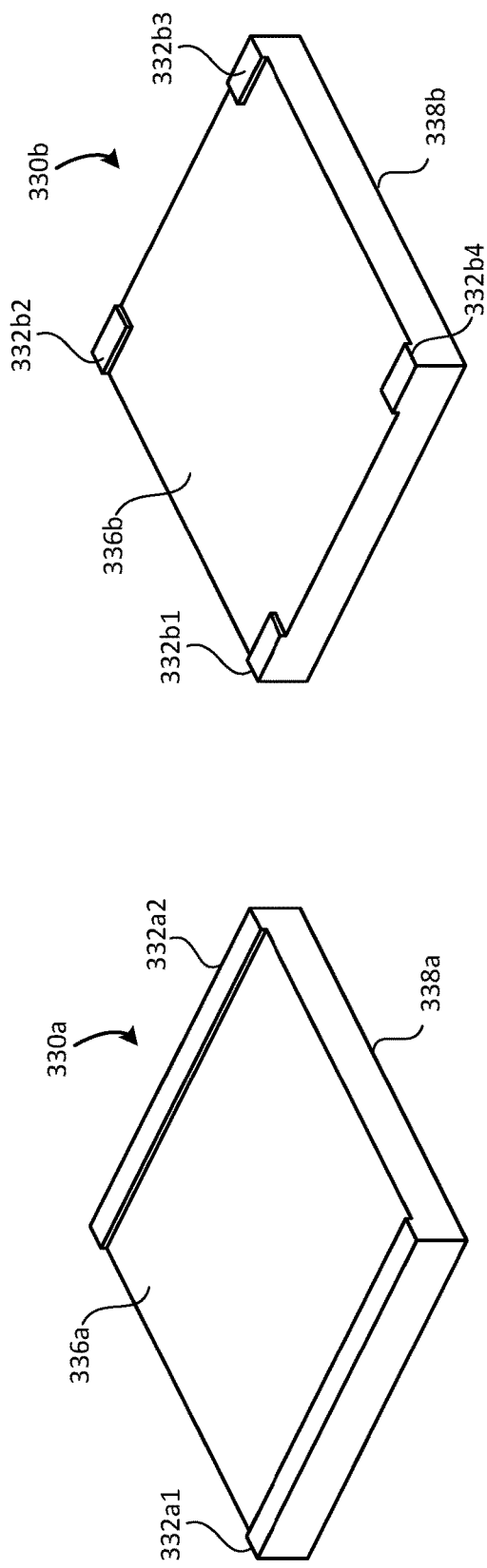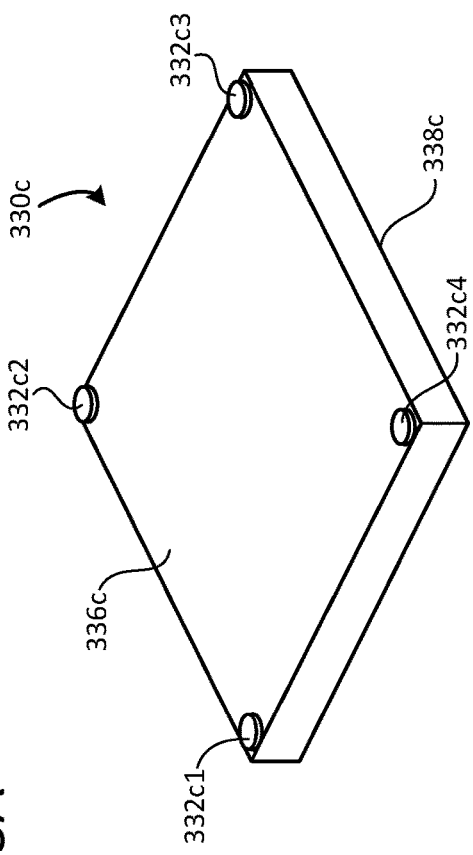
FIG. 3B
FIG. 3C
FIG. 3A

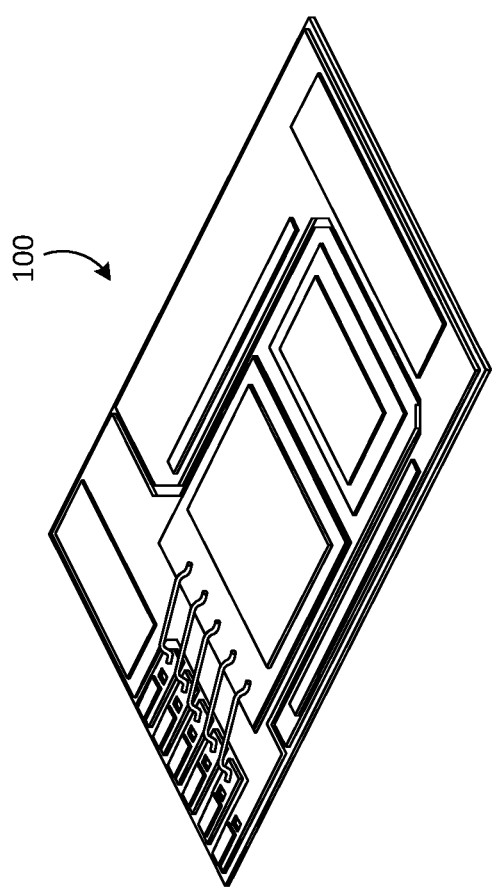
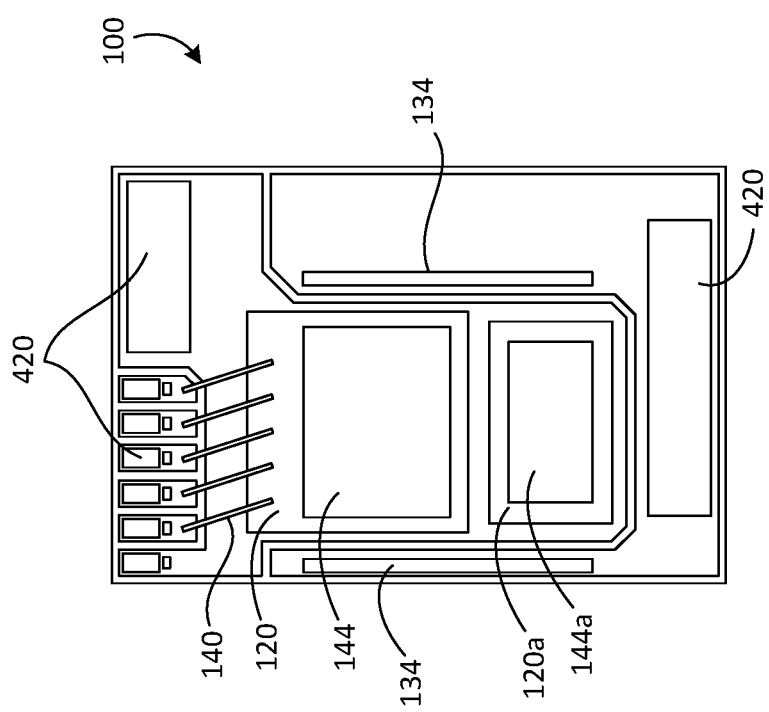
FIG. 4A
FIG. 4B

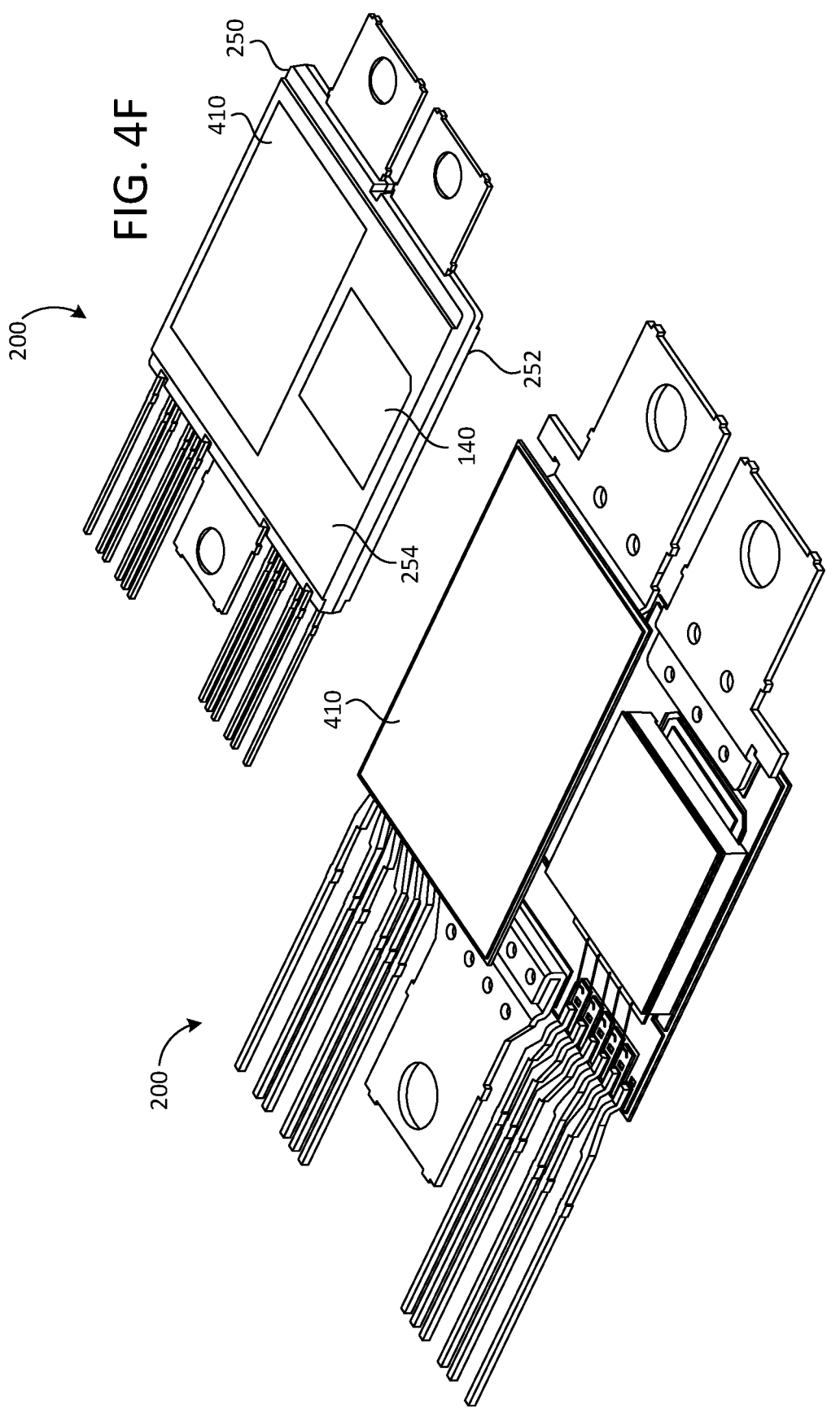

SEMICONDUCTOR DEVICE ASSEMBLIES INCLUDING LOW-STRESS SPACER

TECHNICAL FIELD

This description relates to semiconductor device assemblies. More specifically, this description relates to semiconductor device assemblies (e.g., semiconductor device modules) including spacers that distribute tensile stress.

BACKGROUND

Semiconductor device assemblies, such as assemblies including power semiconductor devices (which can be referred to as power modules, multi-chip power modules, etc.), can be implemented using semiconductor die, substrates (e.g., direct-bonded metal substrates) and conductive spacers (e.g., electrically and/or thermally conductive spacers). For instance, such spacers can provide electrical connections between components of a given assembly, and/or facilitate heat dissipation for the assembly (e.g., resulting from operation of the semiconductor die), such as to facilitate dual-sided cooling of the assembly. Current implementations of such assemblies, however, have certain drawbacks. For instance, due to mismatch between respective thermal coefficients of expansion of substrate (e.g., ceramic) materials; semiconductor die and conductive spacers, various stresses can be exerted on the semiconductor die (e.g., tensile stress, peeling stress, shear stress, etc., exerted on the semiconductor die by the spacer), which can result in damage to the semiconductor die. One approach to reduce such stress is the use of spacers that include (e.g. are formed from) copper-molybdenum (CuMo). Such materials are, however, expensive (adding to overall product cost) and may not achieve acceptable stress levels in some implementations.

SUMMARY

In a general aspect, a semiconductor device assembly can include a substrate, a semiconductor die disposed on the substrate, and a thermally conductive spacer having a first side and a second side, the second side being opposite the first side. The first side of the thermally conductive spacer can include a plurality of steps that are coupled with the substrate. The first side of the thermally conductive spacer can also include a surface that is disposed between the plurality of steps, where the surface can be coupled with the semiconductor die.

In another general aspect, a semiconductor device assembly can include a first substrate, a first semiconductor die disposed on the first substrate, and a first thermally conductive spacer having a first side and a second side, the second side of the first thermally conductive spacer being opposite the first side of the first thermally conductive spacer. The first side of the first thermally conductive spacer can include a plurality of steps that are coupled with the first substrate, and a surface disposed between the plurality of steps, where the surface can be coupled with the first semiconductor die. The semiconductor device assembly can further include a second substrate, a second semiconductor die disposed on the second substrate, a second thermally conductive spacer having a first side and a second side, the second side of the second thermally conductive spacer being opposite the first side of the second thermally conductive spacer. The first side of the second thermally conductive spacer can include a plurality of steps that are coupled with the second substrate, and a surface disposed between the plurality of steps, where the surface can be coupled with the second semiconductor die.

In another general aspect, a semiconductor device assembly can include a first substrate, a semiconductor die disposed on the first substrate, and a thermally conductive spacer having a first side and a second side, the second side being opposite the first side. The first side of the thermally conductive spacer can include a plurality of steps that are coupled with the first substrate, and a surface disposed between the plurality of steps, where the surface can be coupled with the semiconductor die. The semiconductor device assembly can also include a second substrate coupled with the second side of the thermally conductive spacer, the second side of the thermally conductive spacer being planar. The semiconductor device assembly can further include a molding compound encapsulating the semiconductor device assembly such that a surface of the first substrate is exposed through a first surface of the molding compound and a surface of the second substrate is exposed through a second surface of the molding compound, the second surface of the molding compound being opposite the first surface of the molding compound.

BRIEF DESCRIPTION OF THE DRAWINGS

FIGS. 3A through 3C are isometric diagrams illustrating various low-stress spacer implementations.

FIGS. 4A through 4F are a diagrams schematically illustrating an assembly process for producing a semiconductor device assembly with low-stress spacers.

Figure 1:
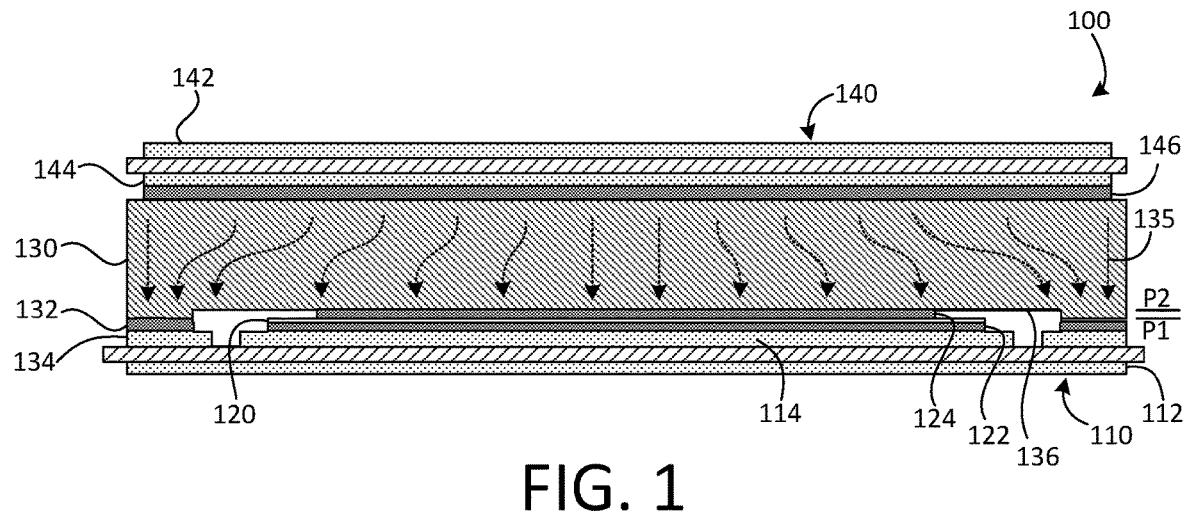
FIG. 1 is a diagram schematically illustrating a side view of a semiconductor device assembly that includes a low-stress spacer.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of semiconductor device assemblies that can be used to implement, e.g., power semiconductor device assemblies, such as multichip modules (MCMs) with dual-sided cooling. Such assemblies can be used in, e.g., automotive applications, industrial applications, etc. For instance, the implementations described herein can be implemented in high-power modules, such as power converters, ignition circuits, power transistor pairs, etc.

In the implementations described herein, a spacer (e.g., a thermally and/or electrically conductive spacer) can be included in a semiconductor device assembly, where the spacer can be referred to as a low-stress, or stress-reducing spacer. In some implementations, the spacer includes a plurality of legs (e.g., portions, members, legs, extensions, protrusions, etc.) that are on a first side of the spacer and is planar on a second (opposite) side of the spacer. The legs of the spacer can be coupled with a substrate, such as a direct-bonded metal (DBM) substrate.

Also, a surface of the spacer that is disposed between the plurality of legs on the first side of the spacer can be coupled with a semiconductor die that is disposed on the substrate. In such implementations, at least some of the stresses resulting from thermal mismatch between the spacer and the semiconductor die (due to differences in respective coefficients of thermal expansion) can be distributed to the substrate, rather than being communicated to the semiconductor die. This distribution of stress to the spacer can reduce the stresses that are exerted on an associated semiconductor die and, thus, can prevent damage to the semiconductor die. Further, in such implementations, thermally and/or electrically conductive materials having lower costs than currently employed spacer materials can be used. For instance, in some implementations, copper, copper alloys, or other materials can be used to implement a low-stress spacer, as compared to CuMo materials of currently used spacers. Simulations results for example implementations of such low-stress spacers have demonstrated that reductions in stresses that are imparted to a given semiconductor die of 10% or more can be achieved, as compared to current (e.g., CuMo) spacer implementations.

FIG. 1 is a diagram schematically illustrating a side view of a semiconductor device assembly (assembly) 100 that includes a low-stress spacer. In some implementations, the assembly 100 can be a sub-assembly of a larger semiconductor device assembly, such as the example implementations described herein with respect to, e.g., FIGS. 2A-2B and FIGS. 4A-4F. For instance, in some implementations, multiple assemblies 100 can be included in a semiconductor device assembly as sub-assemblies. In some implementations, the assembly 100 can be included in a semiconductor device assembly along with one or more sub-assemblies having different arrangements than the assembly 100. However, for purposes of this disclosure, assemblies (e.g., the assembly 100) having a same configuration are shown in the example assemblies illustrated and described herein that include multiple sub-assemblies. It will be appreciated, however, that in some implementations sub-assemblies with different configurations that include respective low-stress spacers can be included in a semiconductor device assembly.

As shown in FIG. 1, the assembly 100 includes a first substrate 110 (e.g., a first DBM substrate), a semiconductor die 120, a low-stress (thermally and/or electrically conductive) spacer 130, and a second substrate 140 (e.g., a second DBM substrate). In some implementations, the substrates 110 and 140 can be direct-bonded copper (DBC) substrates.

As shown in FIG. 1 the semiconductor die 120 (e.g., a first side of the semiconductor die 120) can be coupled to the substrate 110. As further shown in FIG. 1, the spacer 130 can include a plurality of steps 132 that are also coupled to the substrate 110. Also in the assembly 100, the spacer 130 has a surface 136 that is disposed between the plurality of step 132 of the spacer 130, where the surface 136 is coupled to the semiconductor die 120 (e.g., a second side of the semiconductor die 120, opposite the first side). Surfaces of the steps 132 that are coupled with the substrate are aligned in first plane P1, and the surface 136 is aligned along a second plane P2, where the plane P2 is parallel to, and non-coplanar with the plane P1. In FIG. 1, arrows are used to schematically illustrate stress 135 (e.g., tensile stress, etc.) imparted (communicated, transferred, applied, etc.) from the spacer 130 to the semiconductor die 120 and the substrate 110. As illustrated in FIG. 1, the stress 135 from the spacer 120 is distributed between the semiconductor die 120 and between the spacer 130 and the substrate 110, via the steps 132, such that the amount of stress imparted to the die 120, as compared to current implementations, is reduced, thus preventing damage to the die resulting from such stresses from occurring.

As shown in FIG. 1, the substrate 110 can include a metal layer 112 (e.g., disposed on a bottom surface of the substrate 110 as shown in FIG. 1) and a patterned metal layer 114 (e.g., disposed on an upper surface of the substrate 110 as shown in FIG. 1). In some implementations, the metal layer 112 can be exposed through a surface of a molding compound that is used to encapsulate the assembly 100 (e.g., such as shown in FIGS. 2 and 4F.

As further shown in FIG. 1, the semiconductor die 120 can be coupled to a portion of the patterned metal layer 114 using an adhesive material 122 (e.g., a solder print, a preform solder, a sintering material, etc.). Likewise, the steps 132 of the spacer 130 can be coupled to respective portions of the patterned metal layer 114 using an adhesive material 134, which can be a same material, or a different material than the adhesive material 122. As shown in FIG. 1, the patterned metal layer 114 of the substrate 110 can be configured such that the substrate electrically isolates the (first) side of the semiconductor die 120 that is coupled with the substrate 110 from the spacer, such as by having separations between the respective portions of the patterned metal layer 112 to which the semiconductor die 120 and the steps 132 of the spacer are coupled.

The term adhesive material, as used herein, can refer to one or more of the materials indicated above, or, in some implementations, can refer to different adhesive materials. In some implementations, such adhesive materials can be thermally and/or electrically conductive. For purposes of brevity and clarity, the term adhesive material is used herein to refer to materials that can be used to couple elements of example semiconductor device assemblies to one another. The specific adhesive materials used can vary based on the elements being coupled to one another, the specific semiconductor device assembly implementation, the particular manufacturing process being used, etc.

In the assembly 100 of FIG. 1, the surface 136 on the first (bottom) side of the spacer 130 is coupled to the semiconductor die 120 (e.g., to an upper surface of the semiconductor die 120 in FIG. 1) with an adhesive material 124. Also in the assembly 100, the substrate 140 can include a metal layer 142 (e.g., disposed on an upper surface of the substrate 140 in FIG. 1) and a patterned metal layer 144 (e.g., disposed on bottom surface of the substrate 140 in FIG. 1). In some implementations, similar to the metal layer 112, the metal layer 142 can be exposed through a surface (a second surface) of a molding compound that is used to encapsulate the assembly 100. For instance, in some implementations, the metal layer 112 can be exposed through a first surface (e.g., bottom surface as arranged in FIG. 1) of a molding compound and the metal layer 142 can be exposed through a second surface (e.g., top surface as arranged in FIG. 1) of the molding compound, where the second surface can be opposite the first surface. In the assembly 100, the substrate 140 (e.g., via the metal layer 144) can be couples to the spacer 130 (e.g., to a planar upper surface, or upper side of the spacer 130) with an adhesive material 146.

Figure 2A:
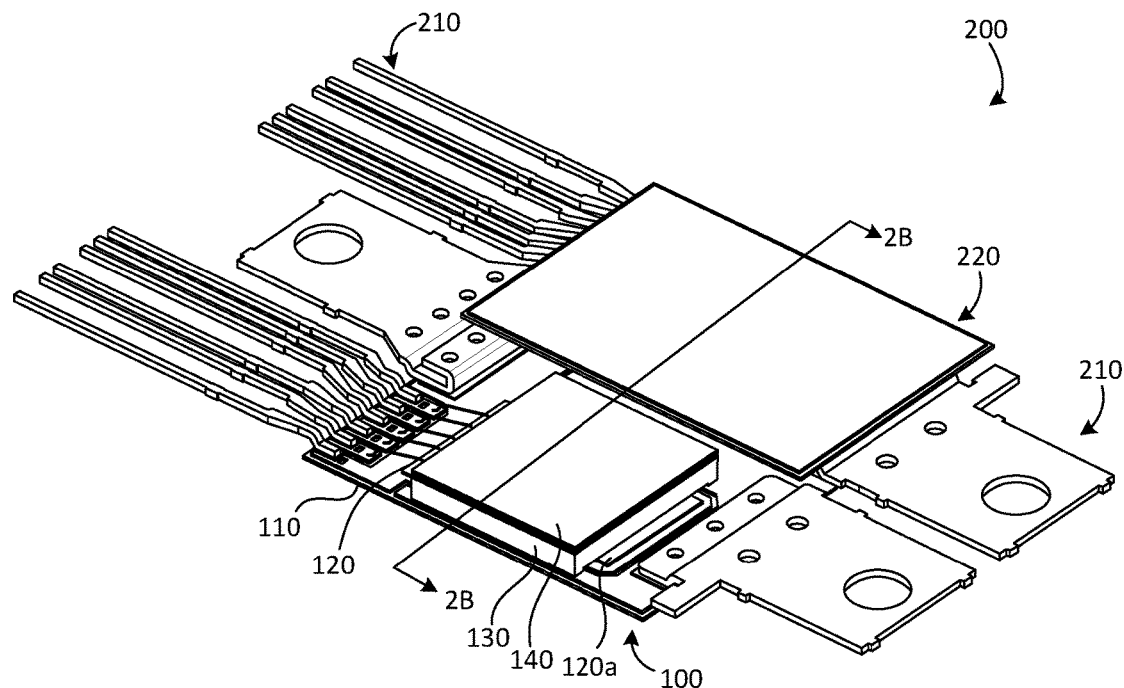
FIG. 2A is an isometric diagram illustrating a semiconductor device assembly including low-stress spacers.

FIG. 2A is an isometric diagram illustrating a semiconductor device assembly (assembly) 200 including low-stress spacers. As shown in FIG. 2A, the assembly 200 includes multiple sub-assemblies. For instance, the assembly 200 includes an assembly (sub-assembly) 100 (such as an implementation of the assembly 100 of FIG. 1) and an assembly (sub-assembly) 220. As noted above, the assembly 220 can be of a same configuration as the assembly 100 or, in some implementations, can be of a different configuration than the assembly 100. For purposes of illustration however, the assembly 220, in the examples described herein, is discussed as having a same configuration as the assembly 100. In the example implementation of FIG. 2A, the assembly 220 is arranged such that is in an inverted orientation relative to the assembly 100.

In FIG. 2A, elements of the assembly 100 are indicated for reference to, and comparison with FIG. 1. For instance, for the assembly 200 as shown in FIG. 2A, in the assembly (sub-assembly) 100, the semiconductor die 100 is disposed on the substrate 110. As also shown in FIG. 2A, a second semiconductor die 120 can also be disposed on the substrate 110. In some implementations, the semiconductor die 120 and 120a can include devices of a power module. For instance, the semiconductor die 120 can include an insulated-gate bipolar transistor (IGBT) or other power transistor, and the semiconductor 120a can include a diode that is coupled in parallel with the IGBT of the semiconductor die 120. In this example, the assembly 100 can be used to implement one half (e.g., a high side or a low-side) of a power transistor pair that is implemented by the assembly 200, where the assembly 220 can implement the other half of the power transistor pair. The assembly 200 can, of course, implement other semiconductor device arrangements, such as parallel arrangement power transistors, as one example.

As also shown in FIG. 2A, in the assembly 200, the spacer 130 is coupled to the substrate 110 (e.g., via a plurality of steps, such as the steps 132 shown in FIG. 1) and to the semiconductor die 120 and 120a (e.g., to upper surfaces of the semiconductor die 120 and 120a, such as via the surface 136 shown in FIG. 1). The assembly 220, in this example implementations, includes a like arrangement of substrate, semiconductor die and low-stress spacer (e.g., a plurality of stress-distributing legs).

As shown in FIG. 2A, the assembly 200 also includes a leadframe 210 that includes a plurality signal leads, a pair of power terminals and an output terminal. The specific arrangement of signal leads, power terminals and output terminal(s) of the leadframe 210 will depend on the specific implementation of the assembly 200 (e.g., on the circuit implemented by the assembly 200), The arrangement shown in FIG. 2A is given by way of example. As shown in FIG. 2A, in some implementations, the signal leads, power terminals and output terminal of the leadframe 210 can be coupled, respectively, with the various substrates of the assembly 200, e.g., using direct-lead attachment.

Figure 2B:
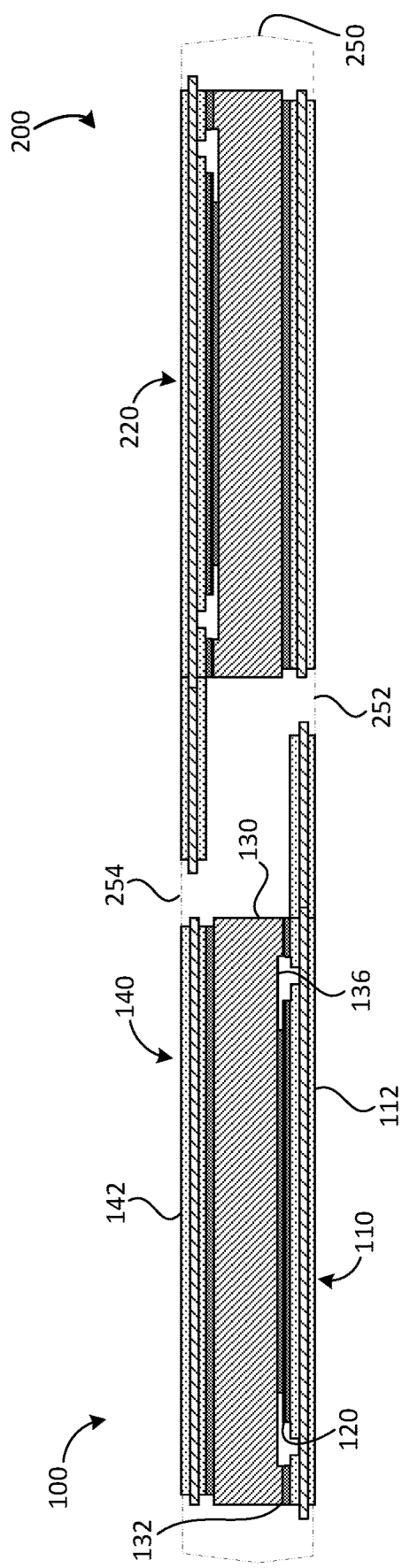
FIG. 2B is a diagram that schematically illustrates a side cross-sectional view of the assembly of FIG. 2A.

FIG. 2B is a diagram that schematically illustrates a side cross-sectional view of the assembly 200 of FIG. 2A. The cross-sectional view of the assembly 200 in FIG. 2B is taken along a section line corresponding with the section line 2B-2B shown in FIG. 2A.

As was noted above the assembly 200 include a first (sub) assembly 100 and a second (sub) assembly 220, where the second assembly 220, in this example, is of a same configuration as the assembly 100. In FIG. 2B, the inverted arrangement of the assembly 220 with respect to the assembly 100 is illustrated. Also, as a result of the location of the section line 2B-2B for the assembly 200 as shown in FIG. 2A, elements of the leadframe 210 of the assembly 200 are not visible in FIG. 2B. As with FIG. 2A, the substrate 110, the semiconductor die 120 and the spacer 130 (as well as the legs 132 of the spacer 130) are indicated in FIG. 2B for reference to, and comparison with FIG. 1.

In the example of FIG. 2B, the assembly 200 further includes a molding compound 250 (indicated by a dashed line) that can be used to encapsulate portions of the assembly 200 of FIG. 2A (such as is illustrated by the example semiconductor device assembly of FIG. 4F). As shown in FIG. 2B, the molding compound 250 can have a first surface 252 (e.g., a bottom surface as arranged in FIG. 2B) and a second surface 254 (e.g., a top surface as arranged in FIG. 2B). In order to facilitate dual side cooling, surfaces (e.g., metal layers of the substrates included in the assemblies 100 and 220 can be exposed (e.g., by grinding after encapsulation in the molding compound 250), respectively on the first surface 252 and the second surface 254 of the molding compound. For instance, the metal layer 112 of the substrate 110 can be exposed on the first surface 252 of the molding compound 250, while the metal layer 142 of the substrate 140 can be exposed on the second surface 254 of the molding compound 250. In this example, metals layers of the substrates of the assembly 220 can be similarly exposed (though inverted relative to the assembly 100) thorough the surfaces 252 and 254 of the molding compound 250. Thermal dissipation mechanisms (e.g., heat sinks, cooling jackets, etc.) can then be affixed with exposed surfaces of the assemblies 100 and 220 to facilitate dual sided cooling of the assembly 200.

FIGS. 3A through 3C are isometric diagrams illustrating various low-stress spacer implementations. Specifically, FIG. 3A illustrates a low-stress spacer 330a, FIG. 3B illustrates a low-stress spacer 330B, and FIG. 3C illustrates a low-stress spacer 330c. Each of the spacers 330a, 330b and 330c include a plurality of steps that are configured to be coupled to a substrate, such as to a DBM substrate in the examples described herein.

Referring to FIG. 3A, the spacer 330a includes a first step 332a1 that is disposed on, and extends along a first edge of a first side (the upward facing side in FIG. 3A) of the spacer 330a. The spacer 330a also includes a second step 332a2 that is disposed on, and extends along a second edge (e.g., opposite the first edge) of the first side of the spacer 330a. In this example, the other two edges of the spacer 330a do not include (e.g., exclude) a step. Referring to FIG. 3B, the spacer 330b includes a first step 332b1 disposed in a first corner of, and on a first side (the upward facing side in FIG. 3B) of the spacer 330b. The spacer 330b also includes a second step 332b2 disposed in a second corner of, and on the first side of the spacer 330b, a third step 332b3 disposed in a third corner of, and on the first side of the spacer 330b, and a fourth step 332b4 disposed in a fourth corner of, and on the first side of the spacer 330b. In the example, spacers of FIGS. 3A and 3B, the steps 332a1-332a2 and 332b1-332b4 can be monolithically formed (e.g., using stamping, etching, casting, etc.) with their respective spacers 330a and 330b.

Referring to FIG. 3C, similar to FIG. 3B, the spacer 330c includes a first step 332c1 disposed in a first corner of, and on a first side (the upward facing side in FIG. 3C) of the spacer 330c. The spacer 330c also includes a second step 332c2 disposed in a second corner of, and on the first side of the spacer 330c, a third step 332c3 disposed in a third corner of, and on the first side of the spacer 330c, and a fourth step 332c4 disposed in a fourth corner of, and on the first side of the spacer 330c. For the spacer 330c, the steps 332a-332d can be formed separately and coupled to the spacer 330c using an adhesive material, such as those materials described herein.

Each of the spacers 330a, 330b and 330c includes a respective surface 336a, 336b and 336b (on the first sides of the spacers) that is disposed between the respective steps of its spacer. In these example implementations, the surfaces 336a-336b are configured to be coupled with at least one semiconductor die, such as the surface 136 of the spacer 130 is coupled with the semiconductor die 120 in the assembly 100 of FIG. 1. Further, each of the spacers 330a, 330b and 330c of FIGS. 3A, 3B and 3C, includes a respective second side 338a, 338b and 338c, where the second sides are opposite their corresponding first sides. In these examples, the sides 338a-338c can be planar, such that they are configured to be coupled with a substrate, such as the substrate 140 is coupled with the spacer 130 in FIG. 1. In some implementations, a surface area of the steps that is coupled with the substrate (e.g., a combined surface area of the steps) can be less than 25 percent, less than 10 percent, etc. than an overall surface area of the spacer (e.g., a surface area of the planar surface opposite the surface including the steps).

Figure 4C:
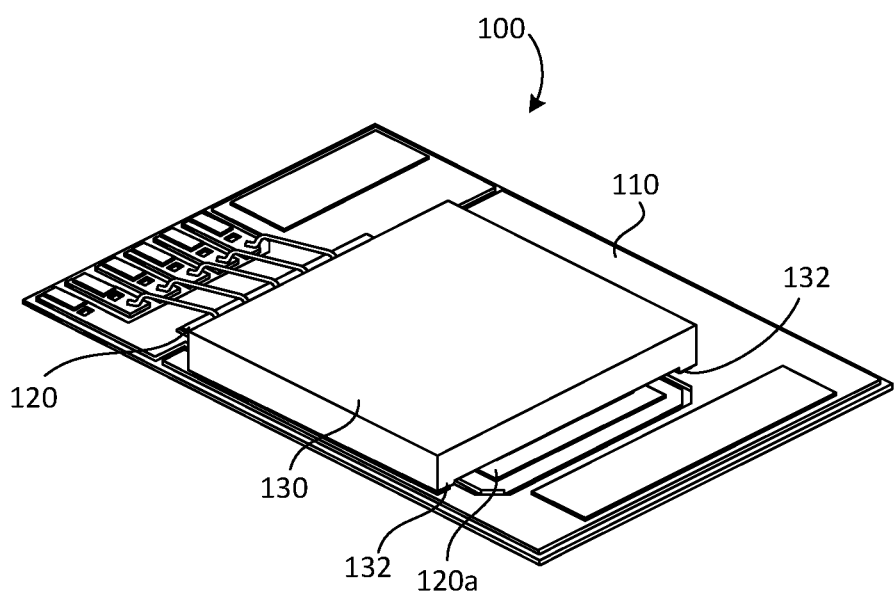
Figure 4D:
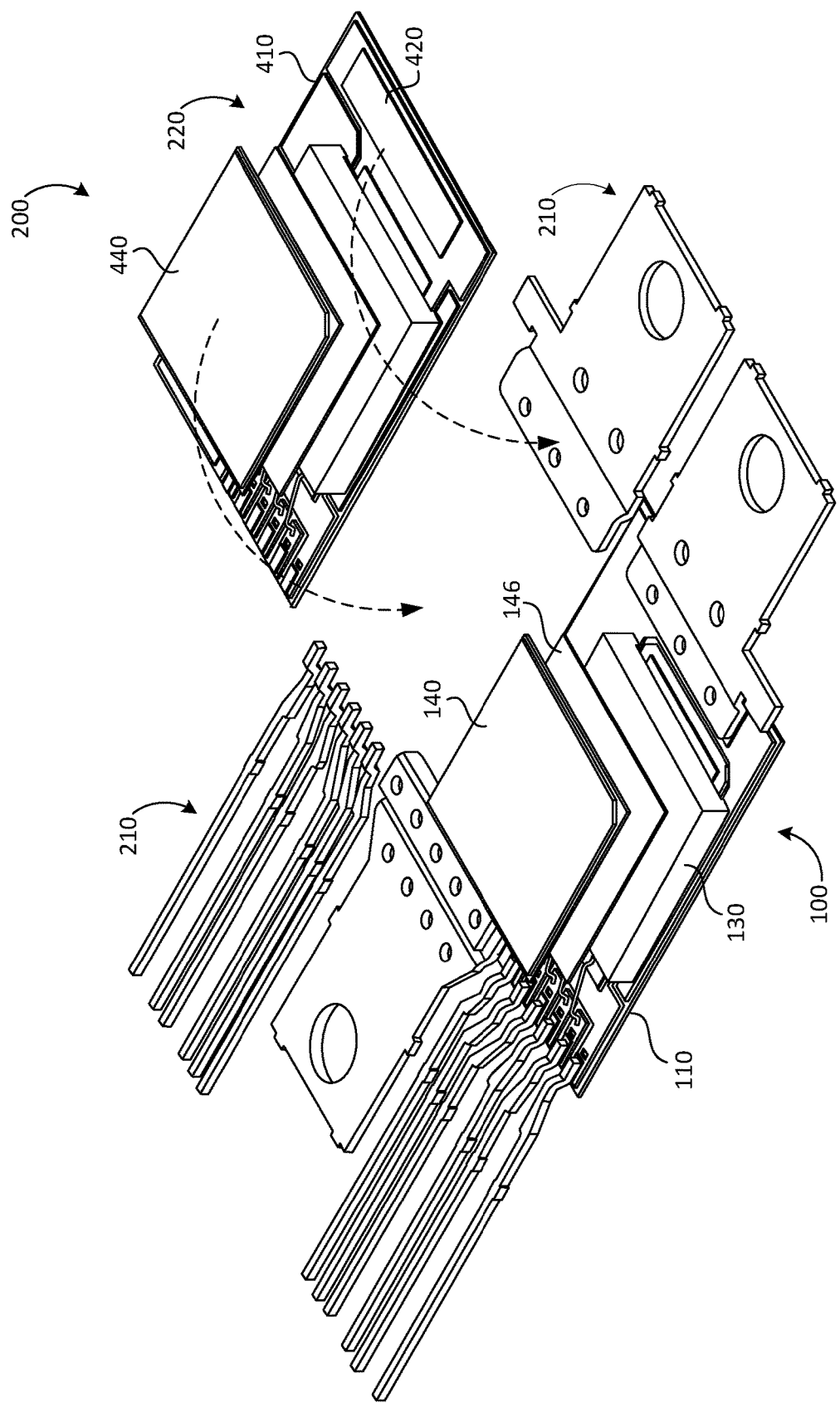

FIGS. 4A through 4F are diagrams schematically illustrating an assembly (manufacturing) process for producing a semiconductor device assembly with low-stress spacers. Specifically, FIGS. 4A-4C illustrate assembly operations for a semiconductor device assembly (e.g., a sub-assembly), such as the assembly 100 of FIGS. 1, 2A and 2B, or the sub-assembly 220 of the assembly 200 of FIGS. 2A and 2B. For purposes of illustration, assembly of a single sub-assembly is shown in FIGS. 4A-4C. FIGS. 4D-4F illustrate assembly of a semiconductor device assembly, such as the assembly 200, including multiple sub-assemblies (e.g., assemblies 100 and 220). In FIGS. 4A-4D, the reference numbers for the sub-assemblies 100 and 220 are used to reference those sub-assemblies while in process (e.g., not yet completed). For instance, in FIGS. 4A-4C, not all elements of the completed assemblies 100 and 220 have been added to (coupled with other elements of) those assemblies, while in FIG. 4D, the assemblies 100 and 220 are shown in exploded views (for purposes of illustration).

Referring to FIG. 4A, producing the assembly 100 can include coupling the semiconductor die 120 and 120a to the substrate 110 (e.g., using a solder, or other attachment process). As also shown in FIG. 4A, wire bonds 410 can be formed between the substrate 110 and the semiconductor die 120 (and/or the semiconductor die 120a), and adhesive material 144, 144a and 420 (e.g., solder print, preform solder, etc.) can be applied for spacer 130 and leadframe 210 attachment. Referring to FIG. 4B, an isometric view of the assembly 100 as shown in FIG. 4A is illustrated. Referring to FIG. 4C, the spacer 130 can be coupled with the semiconductor die 120 and 120a (e.g., such as via the surface 136 of the spacer 130 as shown in FIGS. 1 and 2B). As further shown in FIG. 4C, the spacer 130 can be coupled to the substrate 110 (e.g., using the adhesive material 134) via the steps 132.

Referring to FIG. 4D, the assembly 200 can be produced by coupling the elements of the leadframe 210 with the substrates of the assemblies (sub-assemblies) 100 and 220 (e.g., via the adhesive material 420), and inverting the assembly 220, as shown by the dashed-line arrows in FIG. 4D, in the assembly 200. As illustrated in FIG. 4D, the assembly 220 is of a same configuration as the assembly 100, and includes a substrate 410 (corresponding with the substrate 110) and a substrate 440 (corresponding with the substrate 140). In some implementations, one or more solder reflow operations (or other processes) can be performed to couple the elements of the assembly 200 with each other. FIG. 4E illustrates the assembly 200 prior to molding compound encapsulation. In this example, FIG. 4D corresponds with FIG. 2A. FIG. 4F, which corresponds with the cross-sectional diagram of FIG. 2B, illustrates the assembly 200 after encapsulation in the molding compound 250 and grinding, e.g., to expose surfaces of the substrates on the surfaces 252 and 254 of the molding compound 250. For instance, as shown in FIG. 4F, the substrate 140 of the assembly 100 and the substrate 410 of the assembly 200 can be exposed through the surface 254 of the molding compound 250. The substrate 110 of the assembly 100 and the substrate 440 of the assembly 220 can also be exposed through the bottom surface 252 of the molding compound 250, such as illustrated in FIG. 2B. However, since the surface 252 is downward facing in FIG. 4F, the surfaces of the substrates 110 and 440 are not visible in FIG. 4F.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly comprising:
a first direct-bonded metal (DBM) substrate;
a semiconductor die disposed on the first DBM substrate;
a thermally conductive spacer having a first side and a second side, the second side being opposite the first side,
the first side of the thermally conductive spacer including:
a plurality of steps including at least four steps that are respectively coupled with the first DBM substrate, each step of the at least four steps being included on a respective corner of the first side of the thermally conductive spacer; and
a surface disposed between the plurality of steps, the surface being coupled with the semiconductor die; and
a second DBM substrate coupled with the second side of the thermally conductive spacer.

2. The semiconductor device assembly of claim 1, further comprising a molding compound encapsulating the semiconductor device assembly such that a surface of the first DBM substrate is exposed through a first surface of the molding compound and a surface of the second DBM substrate is exposed through a second surface of the molding compound, the second surface of the molding compound being opposite the first surface of the molding compound.

3. The semiconductor device assembly of claim 1, wherein a first side of the semiconductor die is coupled with the first DBM substrate and a second side of the semiconductor die, opposite the first side of the semiconductor die, is coupled with the surface of the thermally conductive spacer disposed between the plurality of steps.

4. The semiconductor device assembly of claim 3, wherein
the thermally conductive spacer is electrically conductive; and
the first DBM substrate is configured to electrically isolate the thermally conductive spacer from the first side of the semiconductor die.

5. The semiconductor device assembly of claim 1, wherein the plurality of steps are monolithically formed with the thermally conductive spacer.

6. The semiconductor device assembly of claim 1, wherein the second side of the thermally conductive spacer is planar.

7. A semiconductor device assembly comprising:
a first substrate disposed on a first side of the semiconductor assembly;
a first semiconductor die coupled with the first substrate via a first adhesive material;
a first thermally conductive spacer having a first side and a second side, the second side of the first thermally conductive spacer being opposite the first side of the first thermally conductive spacer,
the first side of the first thermally conductive spacer including:
a plurality of steps that are coupled with the first substrate; and
a surface disposed between the plurality of steps, the surface being coupled with the first semiconductor die;
a second substrate disposed on a second side of the semiconductor device assembly, the second side of the semiconductor device assembly being opposite the first side of the semiconductor device assembly;
a second semiconductor die coupled with the second substrate via second adhesive material; and
a second thermally conductive spacer having a first side and a second side, the second side of the second thermally conductive spacer being opposite the first side of the second thermally conductive spacer,
the first side of the second thermally conductive spacer including:
a plurality of steps that are coupled with the second substrate; and
a surface disposed between the plurality of steps, the surface being coupled with the second semiconductor die.

8. The semiconductor device assembly of claim 7, further comprising:
a third substrate coupled to the second side of the first thermally conductive spacer; and
a fourth substrate coupled to the second side of the second thermally conductive spacer.

9. The semiconductor device assembly of claim 8, wherein:
the first substrate is a first direct-bonded metal (DBM) substrate;
the second substrate is a second DBM substrate;
the third substrate is a third DBM substrate; and
the fourth substrate is a fourth DBM substrate.

10. The semiconductor device assembly of claim 9, further comprising a molding compound encapsulating the semiconductor device assembly such that:
a surface of the first substrate is exposed through a first surface of the molding compound;
a surface of the second substrate is exposed through a second surface of the molding compound, the second surface of the molding compound being opposite the first surface of the molding compound;
a surface of the third substrate is exposed through the second surface of the molding compound; and
a surface of the fourth substrate is exposed through the first surface of the molding compound.

11. The semiconductor device assembly of claim 7, wherein the plurality of steps of the first thermally conductive spacer includes:
a first step extending along a first edge of the first side of the first thermally conductive spacer; and
a second step extending along a second edge of the first side of the first thermally conductive spacer.

12. The semiconductor device assembly of claim 7, wherein the plurality of steps of the second thermally conductive spacer includes:
a first step disposed in a first corner of the first side of the second thermally conductive spacer;
a second step disposed in a second corner of the first side of the second thermally conductive spacer;
a third step disposed in a third corner of the first side of the second thermally conductive spacer; and
a fourth step disposed in a fourth corner of the first side of the second thermally conductive spacer.

13. The semiconductor device assembly of claim 7, wherein:
the plurality of steps of the first thermally conductive spacer are monolithically formed with the first thermally conductive spacer; and
the plurality of steps of the second thermally conductive spacer are monolithically formed with the second thermally conductive spacer.

14. The semiconductor device assembly of claim 7, wherein:
the second side of the first thermally conductive spacer is planar; and
the second side of the second thermally conductive spacer is planar.

15. A semiconductor device assembly comprising:
a first direct-bonded metal (DBM) substrate;
a semiconductor die disposed on the first DBM substrate;
a thermally conductive spacer having a first side and a second side, the second side being opposite the first side,
the first side of the thermally conductive spacer including:
a first step disposed in a first corner of the first side of the thermally conductive spacer;
a second step disposed in a second corner of the first side of the thermally conductive spacer;
a third step disposed in a third corner of the first side of the thermally conductive spacer;
a fourth step disposed in a fourth corner of the first side of the thermally conductive spacer; and
a surface disposed between the steps of the thermally conductive spacer, the surface being coupled with the semiconductor die;
a second DBM substrate coupled with the second side of the thermally conductive spacer, the second side of the thermally conductive spacer being planar; and
a molding compound encapsulating the semiconductor device assembly such that a surface of the first DBM substrate is exposed through a first surface of the molding compound and a surface of the second DBM substrate is exposed through a second surface of the molding compound, the second surface of the molding compound being opposite the first surface of the molding compound.

16. The semiconductor device assembly of claim 15, wherein the first step, the second step, the third step and fourth step are monolithically formed with the thermally conductive spacer.

\* \* \* \* \*

UNITED STATES PATENT AND TRADEMARK OFFICE
CERTIFICATE OF CORRECTION

PATENT NO. : 11,217,506 B2  
APPLICATION NO. : 16/721375  
DATED : January 4, 2022  
INVENTOR(S) : Prajuckamol et al.

Page 1 of 1

It is certified that error appears in the above-identified patent and that said Letters Patent is hereby corrected as shown below:

In the Claims

In Column 9, Line 52, Claim 7, delete "semiconductor assembly;" and insert -- semiconductor device assembly; --, therefor.

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*